United States Patent
Fluhrer et al.

(10) Patent No.: US 8,872,411 B2
(45) Date of Patent: Oct. 28, 2014

(54) METHOD FOR OPERATING A PIEZOCERAMIC SENSOR AND CIRCUIT FOR CARRYING OUT THE METHOD

(75) Inventors: Henry Fluhrer, Bretten (DE); Uwe Hoerner, Eppingen (DE)

(73) Assignee: E.G.O. Elektro-Geraetebau GmbH, Oberderdingen (DE)

(*) Notice: Subject to any disclaimer, the term of this patent is extended or adjusted under 35 U.S.C. 154(b) by 362 days.

(21) Appl. No.: 13/542,245

(22) Filed: Jul. 5, 2012

(65) Prior Publication Data

US 2013/0009518 A1    Jan. 10, 2013

(30) Foreign Application Priority Data

Jul. 5, 2011 (DE) .................. 10 2011 078 694

(51) Int. Cl.
*H01L 41/113* (2006.01)
*H03K 17/96* (2006.01)

(52) U.S. Cl.
CPC .... *H03K 17/964* (2013.01); *H03K 2217/96058* (2013.01)
USPC ...... 310/319; 310/314; 310/316.01; 310/318; 310/338

(58) Field of Classification Search
CPC .... H04R 17/00; G10K 11/002; H01L 41/042; H01L 41/107; H02N 2/14; G01L 23/10
USPC ................ 310/314, 316.01, 318, 319, 338
See application file for complete search history.

(56) References Cited

U.S. PATENT DOCUMENTS

| | | | |
|---|---|---|---|
| 6,723,937 B2* | 4/2004 | Englemann et al. | 200/600 |
| 8,106,893 B2 | 1/2012 | Fujita et al. | |
| 2009/0021112 A1* | 1/2009 | Kondou et al. | 310/319 |
| 2009/0146533 A1* | 6/2009 | Leskinen et al. | 310/338 |
| 2011/0082589 A1* | 4/2011 | Witte et al. | 700/275 |

FOREIGN PATENT DOCUMENTS

| | | |
|---|---|---|
| DE | 4035261 A1 | 6/1991 |
| DE | 10117956 A1 | 10/2002 |
| DE | 60317287 T2 | 9/2008 |
| DE | 102008018671 A1 | 10/2009 |
| DE | 102008044030 A1 | 5/2010 |
| EP | 1418673 A1 | 5/2004 |
| EP | 2037582 A2 | 3/2009 |
| EP | 2117122 A1 | 11/2009 |
| EP | 2299596 A1 | 7/2010 |
| WO | WO 01/22587 A1 | 3/2001 |

OTHER PUBLICATIONS

European Patent Office, European Search Report for Application No. 12174992.3, Nov. 12, 2012, 7 pages, The Netherlands.

German Patent and Trademark Office, Office Action for German Application No. 102011078694.5, dated Apr. 20, 2012, 7 pages, Germany.

* cited by examiner

*Primary Examiner* — Derek Rosenau
*Assistant Examiner* — Bryan Gordon
(74) *Attorney, Agent, or Firm* — Alston & Bird LLP

(57) ABSTRACT

In the case of a method for operating a piezoceramic sensor with an evaluation electrode, an electrical signal generated by the piezoceramic sensor at the evaluation electrode is evaluated to determine an actuating state of the piezoceramic sensor. The evaluation electrode is subjected to a predetermined reference potential during recurring time intervals, in order to reference the evaluation electrode with the reference potential during these time intervals.

11 Claims, 4 Drawing Sheets

METHOD FOR OPERATING A PIEZOCERAMIC SENSOR AND CIRCUIT FOR CARRYING OUT THE METHOD

CROSS REFERENCE TO RELATED APPLICATIONS

This application claims priority to German Patent Application No. 10 2011 078 694.5, filed Jul. 5, 2011, which is hereby incorporated by reference in its entirety.

TECHNOLOGICAL FIELD

The invention relates to a method for operating a piezoceramic sensor and to a circuit for carrying out the method.

BACKGROUND

Piezoceramic sensors emit a voltage which is dependent on a pressure applied to the sensor. By means of piezoceramic sensors, it is possible for example to implement a keying function.

The voltage generated by the piezoceramic sensor is usually provided by means of an impedance converter, since the piezoceramic sensor is not suitable for driving greater loads. However, the very high-impedance input of the impedance converter has the consequence that introduced interference pulses have the long-term effect of falsifying the evaluation. It must therefore be ensured that such interference pulses are effectively suppressed. At the same time, it must be ensured that an actuation of the piezoceramic sensor over a longer time period, for example several seconds, can be reliably detected in spite of the interference suppression.

WO 01/22587 A1 discloses a method and associated circuit in which, in a non-actuated state, an evaluation electrode of a piezoceramic sensor is connected to earth by means of a comparatively low-impedance resistor in order to ensure high interference suppression. As soon as an actuation of the piezoceramic sensor is detected, the evaluation electrode is connected to earth by means of a high-impedance resistor instead of the low-impedance resistor, in order to increase the evaluating sensitivity and thus, for example, allow even actuations of longer duration to be reliably detected.

BRIEF SUMMARY

The invention addresses the problem of providing a method for operating a piezoceramic sensor and a circuit for carrying out the method that make reliable evaluation of the piezoceramic sensor possible.

The invention solves this problem by a method and a circuit according to an exemplary embodiment.

In the case of the method for operating a piezoceramic sensor with an evaluation electrode, conventionally an electrical signal generated by the piezoceramic sensor at the evaluation electrode is evaluated to determine an actuating state of the piezoceramic sensor. To this extent, reference should also be made to the relevant technical literature. The evaluation electrode is subjected to a predetermined reference potential, for example earth potential, or a potential which corresponds approximately to half a supply voltage of an associated evaluation circuit during periodically or non-periodically recurring time intervals of identical or variable duration, in order to reference the evaluation electrode with the reference potential during these time intervals. Outside the recurring time intervals, the evaluation electrode is not subjected to the reference potential. A permanent coupling of the evaluation electrode to the reference potential, for example via coupling resistors as in WO 01/22587 A1, does not take place. As a result of being subjected to the reference potential, it is possible for example to compensate for a creeping charge loss in the piezoceramic sensor acting as a capacitor that is caused by leakage currents, in particular while the sensor is not actuated. By contrast with WO 01/22587 A1, there is no permanent discharging of the sensor via variable resistors, but instead charge is typically added during the time intervals, and consequently the voltage at the sensor is maintained.

In one example embodiment, a respective time interval has a time interval period and successive time intervals are spaced apart in time by a time interval repeat period, the time interval period being chosen to be constant or variable and/or the time interval repeat period being chosen to be constant or variable.

In another example embodiment, the following steps are also carried out: measuring a voltage variation at the evaluation electrode, in particular while the evaluation electrode is not being subjected to the reference potential, evaluating the measured voltage variation, in order if applicable to determine an interference pulse, it being possible to consider for the evaluation, for example, a rate of rise of the voltage variation, an amplitude or signal level of the voltage variation and/or a pulse period of the voltage variation, if it has a substantially pulse-shaped variation, and subjecting the evaluation electrode to the reference potential for a time interval period that is chosen in particular to be greater than an average time interval period when the interference pulse has been determined, in order to effectively suppress the effects of the interference pulse. For evaluating the measured voltage variation, said variation may be compared with the voltage variation of a typical actuation, for example with regard to a rate of rise, a duration of rise, a total duration, etc., each voltage variation that does not correspond to the variation of the typical actuation being classified as an interference pulse.

In a further example embodiment, the following steps are also carried out: measuring a voltage variation at the evaluation electrode and evaluating the measured voltage variation, in order if applicable to determine an actuation of the piezoceramic sensor, the time interval repeat period for the case of the possibly determined actuation being chosen to be at least as great as a determined actuation period, so that the evaluation electrode is not subjected to the reference potential during the possibly determined actuation.

Alternatively, the following steps are carried out: choosing a constant time interval repeat period, i.e. the time intervals are periodically repeated, measuring a voltage variation at the evaluation electrode, integrating the measured voltage variation and evaluating the integrated voltage variation to determine an actuating state of the piezoceramic sensor. For this case, the referencing is also performed with the sensor actuated.

The circuit for carrying out the aforementioned method has: means for subjecting the evaluation electrode of the piezoceramic sensor to the predetermined reference potential during the recurring time intervals.

In one example embodiment, the circuit has a reference voltage source for generating the reference potential or the reference voltage.

In another example embodiment, the reference potential is an earth potential or a potential between the earth potential and a supply voltage of the circuit, for example 2.5 V if the supply voltage is 5 V.

In a further example embodiment, the circuit has: an activatable switching means, which with one terminal is subjected to the reference potential, with another terminal is connected to the evaluation electrode and, in dependence on an activation signal, connects the evaluation electrode to the reference potential or disconnects it therefrom, and a control device for generating the activation signal.

In another example embodiment, the circuit has: an impedance converter with a high-impedance input and a low-impedance output, the impedance converter receiving at its input the electrical signal generated at the evaluation electrode and emitting at its output said signal with low impedance, and an evaluation device, which evaluates the signal emitted at the output of the impedance converter.

In a further example embodiment, the circuit comprises a microprocessor, the reference voltage source and/or the impedance converter being integrated in the microprocessor.

BRIEF DESCRIPTION OF THE SEVERAL VIEWS OF THE DRAWINGS

Figure 1:
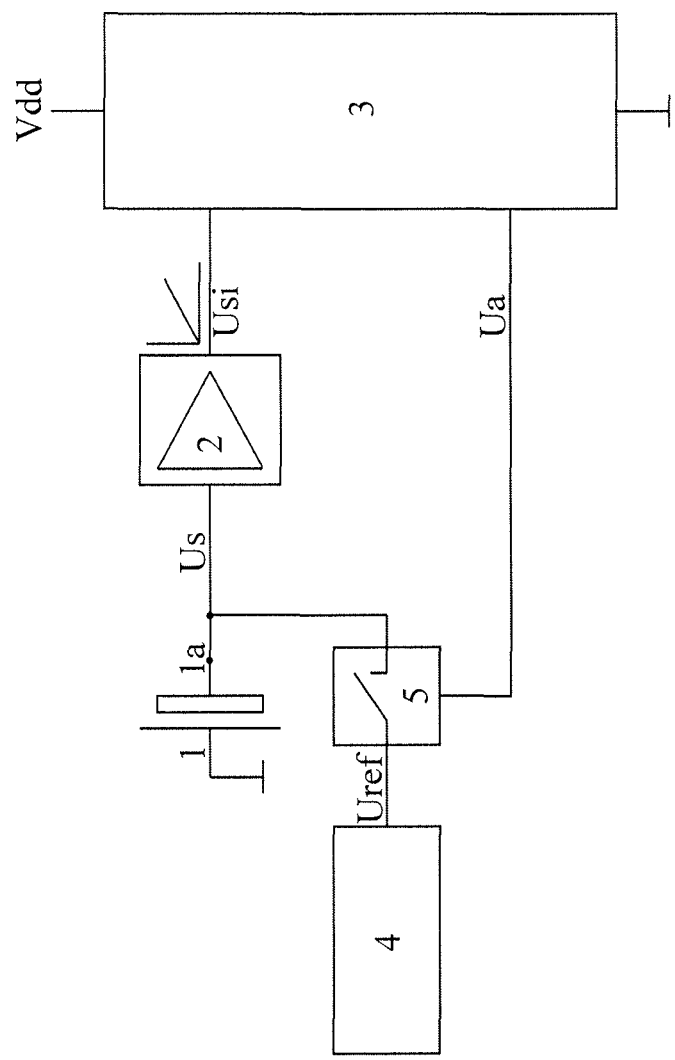
Figure 2:
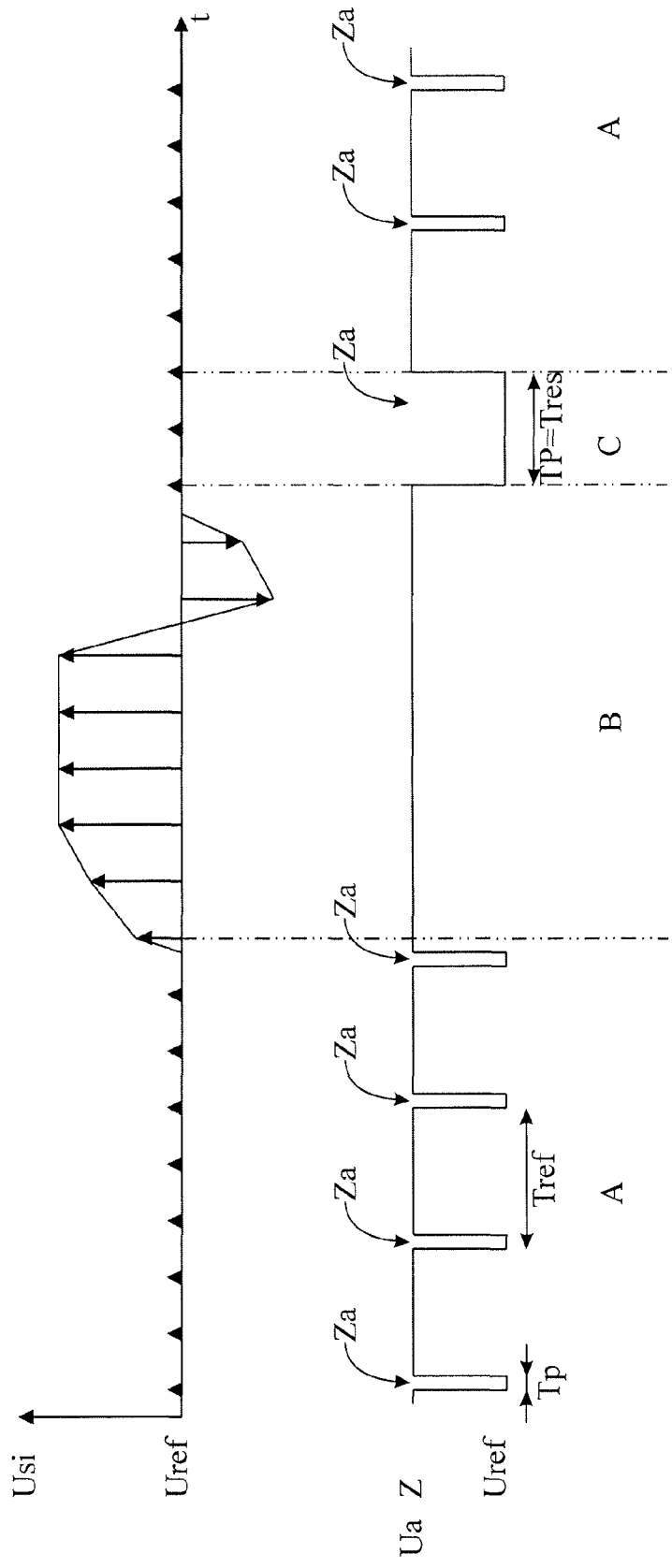
Figure 3:
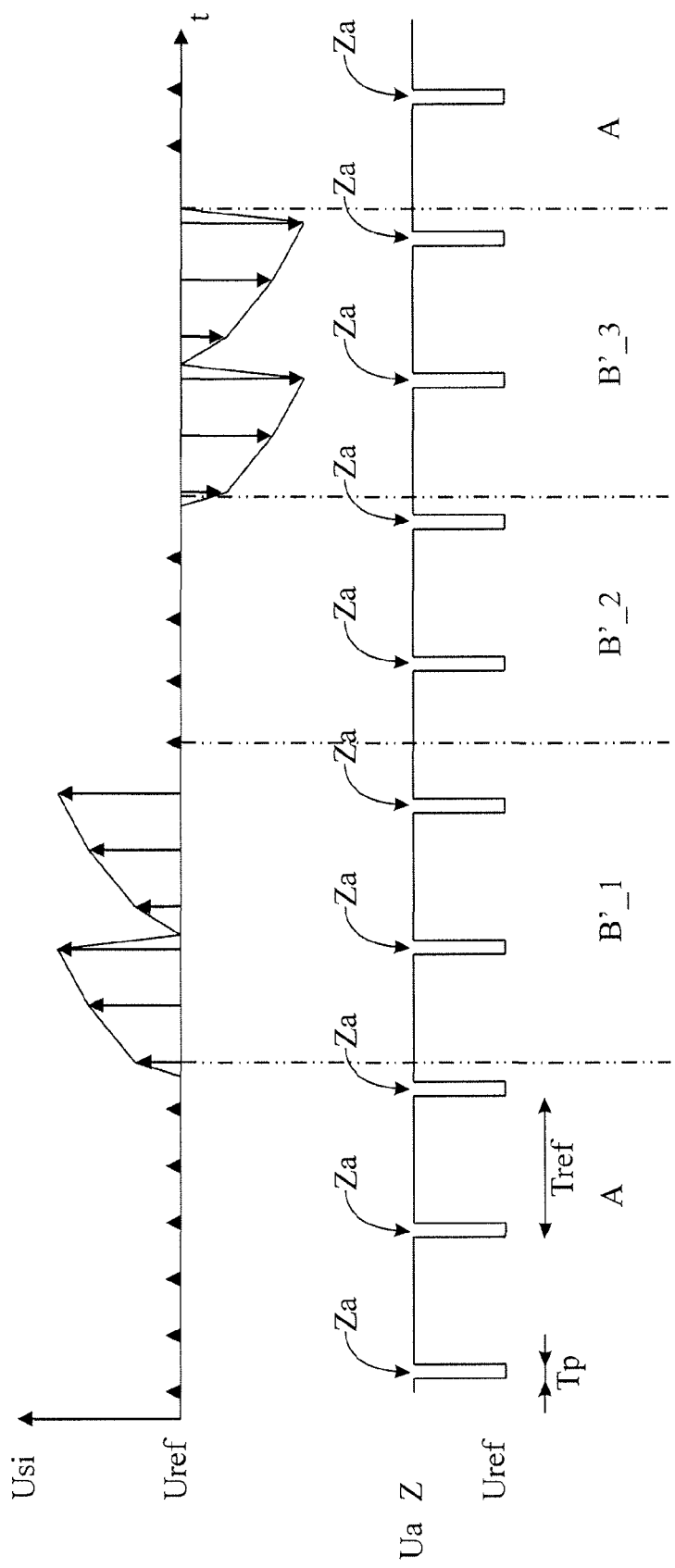
Figure 4:
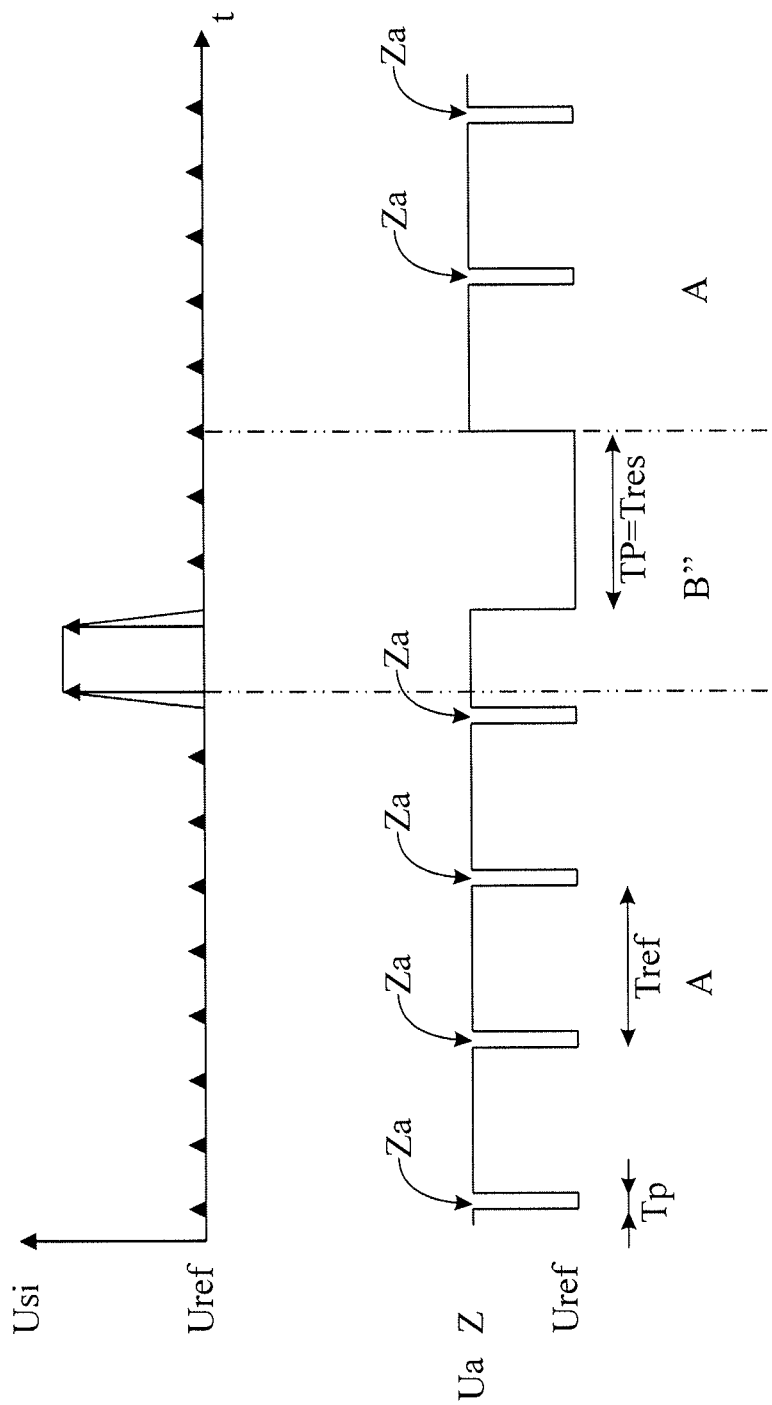

Having thus described the invention in general terms, reference will now be made to the accompanying drawings, which are not necessarily drawn to scale, and wherein:

FIG. 1 shows a circuit according to the invention for operating a piezoceramic sensor, FIG. 2 shows a variation over time of signals of the circuit shown in FIG. 1 according to a first embodiment, FIG. 3 shows a variation over time of signals of the circuit shown in FIG. 1 according to a further embodiment and FIG. 4 shows a variation over time of signals of the circuit shown in FIG. 1 for the case of an interference pulse.

DETAILED DESCRIPTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 shows a circuit according to the invention for operating a piezoceramic sensor 1 with an evaluation electrode 1$a$, evaluating an electrical signal Us that is generated by the piezoceramic sensor 1 at the evaluation electrode 1$a$ during the operation of the circuit to determine an actuating state, i.e. depressed or not depressed, of the piezoceramic sensor 1.

The circuit comprises an impedance converter 2 with a high-impedance input and a low-impedance output, the impedance converter 2 receiving at its input the electrical signal Us generated at the evaluation electrode 1$a$ and emitting it at its output impedance-converted as signal Usi.

An evaluation device 3, for example in the form of a microprocessor with an analog input, evaluates the signal Usi emitted at the output of the impedance converter 2 to determine the actuating state of the piezoceramic sensor 1.

For interference suppression, means for subjecting the evaluation electrode 1$a$ to a predetermined reference potential or a predetermined reference voltage Uref during recurring time intervals (see FIGS. 2 to 4 "Za") are provided. These means comprise a reference voltage source 4 for generating the reference potential or the reference voltage Uref, for example Vdd/2, where Vdd represents a supply voltage of the circuit, an activatable switching means 5, which with one terminal is subjected to the reference potential or the reference voltage Uref, with another terminal is connected to the evaluation electrode 1$a$ and, in dependence on an activation signal Ua, connects the evaluation electrode 1$a$ to the reference potential or the reference voltage Uref or disconnects it therefrom, and a control device 3 for generating the activation signal Ua. The control device and the evaluation device may be jointly integrated in a microprocessor 3, which realizes both the control function and the evaluation function.

FIG. 2 shows a variation over time of signals of the circuit shown in FIG. 1 according to a first embodiment.

The voltage Usi emitted by the impedance converter 2 is sampled periodically at a sampling rate by the evaluation device or an A/D converter of the microprocessor 3, which is symbolized by arrows.

In a time period "A", the sampled voltage Usi is constant and corresponds to a non-actuated state. For this case, the activation signal Ua is generated in such a way that the evaluation electrode 1$a$ is subjected to the reference potential Uref during recurring time intervals Za (the signal state of the activation signal Ua for this case is "Uref"). Outside the time intervals Za, the switching position of the switching means 5 as a result of the state of the control signal Ua (the signal state of the activation signal Ua for this case is "Z") is such that the evaluation electrode 1$a$ is not subjected to the reference potential Uref. The time intervals Za recur periodically in the time period "A" with a time interval repeat period Tref and have a constant time interval period Tp.

In a time period "B", the sampled voltage Usi has a variation which corresponds to a typical key actuation, i.e. the sampled voltage initially increases with a characteristic increase, then remains approximately constant for an actuation period and then, when the sensor key 1 is no longer depressed, decreases again with a slight undershoot to the constant value of the time period "A". This voltage variation is evaluated in the evaluation device or the microprocessor 3, which then detects a key actuation on the basis of stored parameters.

For this case, the activation signal Ua is generated during the actuation sensed by the evaluation device or the microprocessor 3 with the signal state "Z", so that the subjecting of the evaluation electrode 1$a$ to the reference potential Uref is suppressed during the determined actuation, i.e. the time interval repeat period Tref is chosen to be at least as great as the determined actuation period. In this way, a longer-lasting actuation can be detected easily and reliably, since no resetting of the voltage takes place at the evaluation electrode 1$a$.

In a time period "C", the sampled voltage has a variation which corresponds again to a non-actuated state. The evaluation electrode 1$a$ is then subjected to the reference potential Uref for a predetermined time interval period or resetting time period Tp=Tres, in order to re-establish a defined initial state. The resetting period Tres is greater here than the duration Tp of the time intervals Za in the time period "A". After the resetting, the same procedure is followed as in the previously described time period "A".

FIG. 3 shows a variation over time of signals of the circuit shown in FIG. 1 according to a further embodiment, in which the evaluation electrode 1$a$ is periodically referenced actuation-independently, i.e. the time interval repeat period Tref is constant. In order nevertheless to be able to detect a permanent actuation of the sensor 1, the sampled voltage Usi is integrated in the evaluation device 3, the integrated voltage finally mapping the actuating state and being evaluated.

In a time period B'_1, a rise in pressure takes place at the sensor 1 as a result of a commencing actuation. In a time period B'_2, the pressure at the sensor 1 remains approximately constant. In a time period B'_3, the actuation ends. The integral of the sampled voltage Usi corresponds substantially to the variation of the sampled voltage Usi that is shown in FIG. 2, so that a longer-lasting actuation can be detected although an actuation-independent, periodic resetting of the voltage takes place at the evaluation electrode 1a.

FIG. 4 shows a variation over time of signals of the circuit shown in FIG. 1 for the case of a transient interference pulse.

The voltage variation of the sampled voltage Usi does not correspond with regard to the rate of rise, duration, amplitude, etc. to the variation of a typical key actuation, so that a transient interference pulse can be concluded.

As a consequence, in the time period "B", the evaluation electrode 1a is subjected to the reference potential Uref for the time interval period or resetting time period Tp=Tres, in order to reliably suppress the interference pulse.

Subsequently, operation is continued as described above with respect to the time period "A".

The embodiments shown make reliable and interference-immune evaluation of the piezoceramic sensor possible, in particular for the case of a longer-lasting actuation.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation That which is claimed:

1. Method for operating a piezoceramic sensor having an evaluation electrode, wherein an electrical signal generated by the piezoceramic sensor at the evaluation electrode is evaluated to determine an actuating state of the piezoceramic sensor, comprising the step of:
    applying a predetermined reference potential to the evaluation electrode during recurring time intervals.

2. Method according to claim 1, wherein
    the time intervals respectively have a time interval period and successive time intervals are spaced apart in time by a time interval repeat period, the time interval period being chosen to be constant or variable and/or the time interval repeat period being chosen to be constant or variable.

3. Method according to claim 2, comprising the steps of:
    measuring a voltage variation at the evaluation electrode,
    evaluating the measured voltage variation, in order if applicable to determine an interference pulse, and
    applying the reference potential to the evaluation electrode for a time interval period that is chosen in particular to be greater than an average time interval period when the interference pulse has been determined.

4. Method according to claim 2, comprising the steps of:
    measuring a voltage variation at the evaluation electrode, and
    evaluating the measured voltage variation, in order if applicable to determine an actuation of the piezoceramic sensor, the time interval repeat period for the case of the possibly determined actuation being chosen to be at least as great as a determined actuation period, so that the reference potential is not applied to the evaluation electrode during the possibly determined actuation.

5. Method according to claim 2, comprising the steps of:
    choosing a constant time interval repeat period,
    measuring a voltage variation at the evaluation electrode,
    integrating the measured voltage variation and
    evaluating the integrated voltage variation to determine an actuating state of the piezoceramic sensor.

6. Circuit for carrying out the method according to claim 1, comprising:
    means for applying the predetermined reference potential to the evaluation electrode of the piezoceramic sensor during the recurring time intervals.

7. Circuit according to claim 6, comprising:
    a reference voltage source for generating the reference potential.

8. Circuit according to claim 6, wherein:
    the reference potential is an earth potential or a potential between the earth potential and a supply voltage of the circuit.

9. Circuit according to claim 6, comprising:
    a switching means having a first terminal, the reference potential being applied to the first terminal, and having a second terminal, the second terminal being connected to the evaluation electrode, the switching means in response to an activation signal connecting the evaluation electrode to the reference potential or disconnecting it therefrom; and
    a control device for generating the activation signal.

10. Circuit according to claim 6, comprising:
    an impedance converter having a high-impedance input and a low-impedance output, the impedance converter receiving at its input the electrical signal generated at the evaluation electrode and emitting it at its output, and
    an evaluation device, which evaluates the signal emitted at the output of the impedance converter.

11. Circuit according to claim 7, comprising:
    a microprocessor, the reference voltage source and/or the impedance converter being integrated in the microprocessor.

* * * * *